United States Patent
Teer et al.

(10) Patent No.: US 10,224,189 B2
(45) Date of Patent: Mar. 5, 2019

(54) APPARATUS AND A METHOD FOR DEPOSITION OF MATERIAL TO FORM A COATING

(71) Applicant: Teer Coatings Limited, Droitwich, Worcestershire (GB)

(72) Inventors: Dennis Teer, Droitwich (GB); Paul Teer, Droitwich (GB); Kevin Cooke, Droitwich (GB); Hailin Sun, Droitwich (GB)

(73) Assignee: Teer Coatings Limited, Droitwich (GB)

(*) Notice: Subject to any disclaimer, the term of this patent is extended or adjusted under 35 U.S.C. 154(b) by 0 days.

(21) Appl. No.: 15/278,921

(22) Filed: Sep. 28, 2016

(65) Prior Publication Data

US 2017/0047205 A1    Feb. 16, 2017

Related U.S. Application Data

(63) Continuation-in-part of application No. 12/994,053, filed on Sep. 30, 2011, now abandoned.

(51) Int. Cl.
 *H01J 37/34* (2006.01)
 *C23C 14/35* (2006.01)

(52) U.S. Cl.
 CPC ........ *H01J 37/3408* (2013.01); *C23C 14/355* (2013.01); *H01J 37/345* (2013.01); *H01J 37/3417* (2013.01)

(58) Field of Classification Search
 CPC ... H01J 37/3408; H01J 37/3417; H01J 37/345
 See application file for complete search history.

(56) References Cited

U.S. PATENT DOCUMENTS

| | | | |
|---|---|---|---|
| 3,507,774 A * | 4/1970 | Muly, Jr. | C23C 14/355 204/298.06 |
| 4,525,262 A * | 6/1985 | Class | H01J 37/3405 204/192.12 |
| 5,500,102 A | 3/1996 | Ichikawa et al. | |
| 5,556,519 A | 9/1996 | Teer | |
| 6,726,993 B2 * | 4/2004 | Teer | C23C 14/0605 428/216 |
| 2003/0129407 A1 | 7/2003 | Teer et al. | |
| 2005/0126486 A1 * | 6/2005 | Teer | C23C 14/0084 118/723 E |

FOREIGN PATENT DOCUMENTS

| | | |
|---|---|---|
| GB | 2340845 | 3/2000 |
| WO | 2008003973 | 1/2008 |

* cited by examiner

*Primary Examiner* — John J Brayton
(74) *Attorney, Agent, or Firm* — Head, Johnson, Kachigian & Wilkinson, PC

(57) ABSTRACT

Apparatus and a method for creation and maintenance of a closed field system in which magnetrons and/or magnet assemblies are provided in a form to create a magnetic field around an area in which a substrate to be coated is located. The method also relates to the steps of cleaning the substrates and applying an adhesive layer prior to the material which is to form the coating.

9 Claims, 7 Drawing Sheets

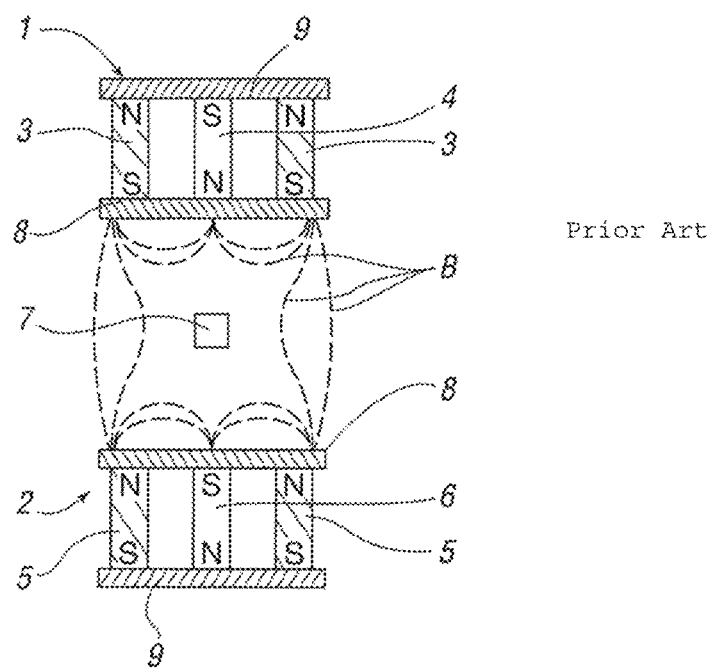
Prior Art
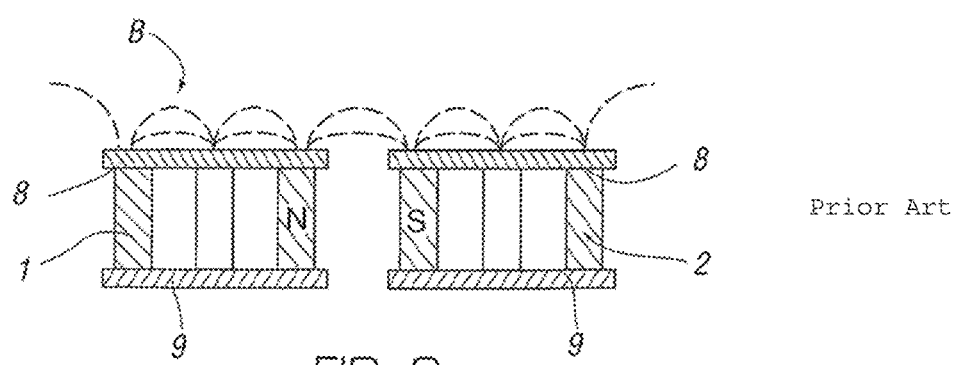
Prior Art

APPARATUS AND A METHOD FOR DEPOSITION OF MATERIAL TO FORM A COATING

CROSS-REFERENCE TO CO-PENDING APPLICATIONS

This application is a continuation-in-part of U.S. patent application Ser. No. 12/994,053 filed Sep. 30, 2011.

BACKGROUND OF THE INVENTION

1. Field of the Invention

This invention relates to equipment for the Physical Vapour Deposition technique of magnetron sputter ion plating, that is to say for depositing materials in atomic and/or ionic form onto a receiving substrate by electrical discharge, for example to form coatings thereon.

2. Prior Art

Sputtering is a well-known process in which a cathode of a glow discharge is made a target for ions produced in the glow discharge in a surrounding low-pressure gas. The ions are accelerated towards the target by an electric field and the impact of them on the target displaces particles of the surface of the target; these particles are deposited on the surface of a suitably placed substrate to form the coating. It is known that the intensity of the glow discharge can be increased significantly by a magnetron effect, which causes the ionisation electrons to be trapped in a region where the electric field is crossed by an added magnetic field. This is the basis of magnetron sputtering, which gives deposition rates approximately ten times those from non-magnetron electrodes and also allows sputtering to take place at much lower gas pressures. Magnets are placed to produce lines of force passing across and above the surface of the target.

Ion plating is a well-known process in which a metal vapour produced in a vacuum system is deposited onto a substrate whilst, simultaneously, the substrate is bombarded with ions. The ion bombardment improves both the adhesion and the structure of the coating.

The metal vapour for ion plating can be produced by several techniques including sputtering. If sputtering is used as the vapour source in ion plating, the technique is called sputter ion plating. If magnetron sputtering is used as the vapour source in ion plating the technique is called magnetron sputter ion plating.

In ion plating, the ions which bombard the sample during deposition can be produced by several methods. In the basic ion plating method, the ions are produced in an abnormal glow discharge with the samples acting as the cathode. This is an inefficient process and typically less than 1 atom in 1000 is ionised in an abnormal glow discharge. The ion current to the samples is low, and is not sufficient to produce the dense coatings required in many applications, even though the samples are held at a high negative potential.

The ionisation can be increased in several ways. For example, the supply of ionising electrons can be increased by means of a hot filament and an electrode which is positive with respect to the filament, or a hollow cathode can also be used to provide a copious supply of electrons.

Rather than use additional filaments and electrodes to provide ionisation enhancement, it is convenient to use a vapour source that itself can act as a source of ionisation. A hot filament electron beam gun evaporator, a resistance heated crucible, and a simple diode sputter electrode are commonly used deposition sources that create little extra ionisation. On the other hand, hollow cathode electron beam guns, glow discharge beam guns and arc sources all produce intense ionisation at a level of over 50% ionisation without the need for additional ionisation enhancement devices, and consequently can be used to produce very dense coatings in ion plating systems.

Magnetron sputtering electrodes have been used in ion plating systems and they do increase the ionisation, but in the past this has not been sufficient to affect the coating structure and to produce dense coatings. A recent development has been the use of an unbalanced magnetron which has inner and outer magnets and in which the field strength of the outer magnets is much higher than the field strength of the inner magnets.

The 'extra' field lines leaving the outer magnets trap electrons escaping from the magnetron discharge and prevent them from drifting to the various earthed parts of the chamber. These electrons cause ionisation in the vicinity of the electrically biased substrate and the ions so formed are attracted to the substrate by the substrate bias, and the substrates receive a higher ion current than in a situation where the magnetrons are balanced. However, the intensity of ionisation may still be less than is desirable for the deposition of dense coatings, unless the outer magnets are made exceptionally strong.

It is thus clear that there are many ways of creating ions for sputtering or ion plating.

The aim of the invention is to provide an improved magnetron sputter ion plating system, with an increased intensity of useful ionisation.

SUMMARY OF THE INVENTION

According to the invention in a first aspect there is provided a magnetron sputter ion plating-system comprising electric field means for producing an electric field directed towards a substrate to be coated and magnetic field means, the magnetic field means comprising at least two magnetrons and/or magnet assemblies, each having an inner portion and an outer portion of opposite polarity characterised in that the magnetrons and/or magnet assemblies are so arranged that the outer portion of one magnetron or magnet assembly and the outer portion of the other, or another, magnetron or magnet assembly are disposed adjacent to each other and at least one of the magnetrons or magnet assemblies is of opposite polarity so that magnetic field lines extend between said magnetrons and magnet assemblies and substantially prevent the escape of electrons from the system between the magnetrons and/or magnet assemblies.

In one embodiment the magnetrons and/or magnet assemblies are arranged so that adjacent magnetrons and magnet assemblies have outer rings of opposite polarities.

The inner pole can be a single magnet, or a line or group of magnets. The outer "ring" pole can be formed from a single magnet or several separate magnets side by side. The "ring" need not be cylindrical or circular, but could be of square shape, or indeed any suitable figure.

The linking of the two magnetrons and/or magnet assemblies by magnetic flux traps electrons in the system and increases the amount of ionisation which occurs. We can thus provide practical magnetron sputter ion plating systems that give significantly increased ionisation using either balanced magnetrons or unbalanced magnetrons or magnet assemblies with outer magnets of moderate field strength.

Preferably the outer, ring, poles are angularly spaced relative to the position of the substrate to be coated so that they subtend a substantial angle at that substrate.

The system may comprise a plurality of magnetrons and/or magnet assemblies the adjacent outer poles, or end regions, of which are of opposite polarities. The magnetrons and/or magnet assemblies are preferably arranged around the substrate and the substrate may have a generally central position between the magnetrons and/or magnet assemblies. Preferably the are equally-angularly spaced in a polygon or ring around the substrate. In one embodiment the arrangement is for a magnetron, then a magnet assembly, then a magnetron, and so on.

The electric field may be provided extending substantially radially between the substrate and the magnetrons and/or magnet assemblies, the substrate being at a negative electrical potential. The negative potential of the substrate may vary from zero up to substantially higher values, say −1000V.

The magnetron poles may comprise a target of source material from which ions are produced.

Preferably there are an even number of magnetrons and/or Magnet assemblies.

The system may further comprise a pumping port to control the pressure of an ionising gas, such as argon, in the system.

According to a second aspect the invention comprises a method of magnetron sputter ion plating in which the magnetic flux between a plurality of magnetrons and/or magnet assemblies comprises a substantially closed ring which traps substantially all electrons which enter the ring.

In this way the ion density in the plating system is significantly increased.

In one embodiment the apparatus is provided with a plurality of magnetrons. Alternatively, the apparatus is provided with magnetrons and magnet assemblies, with the magnet assemblies positioned between respective magnetrons. In each case the polarities of the magnetrons and magnet assemblies outer portions are selected so as to be in accordance with the invention as herein described.

In one embodiment the method involves the process of cleaning the substrates to be coated and then depositing material thereon.

In one embodiment the substrates are cleaned, an adhesion layer of material is applied thereon, and a further layer of material is subsequently applied.

BRIEF DESCRIPTION OF THE DRAWINGS

Embodiments of the invention will now be described by way of example only with reference to the accompany drawings of which:

FIG. 2 schematically illustrates another system and shows the arrangement of magnetic polarities when two magnetrons are side by side;

DETAILED DESCRIPTION OF THE PREFERRED EMBODIMENTS

Figure 1B:
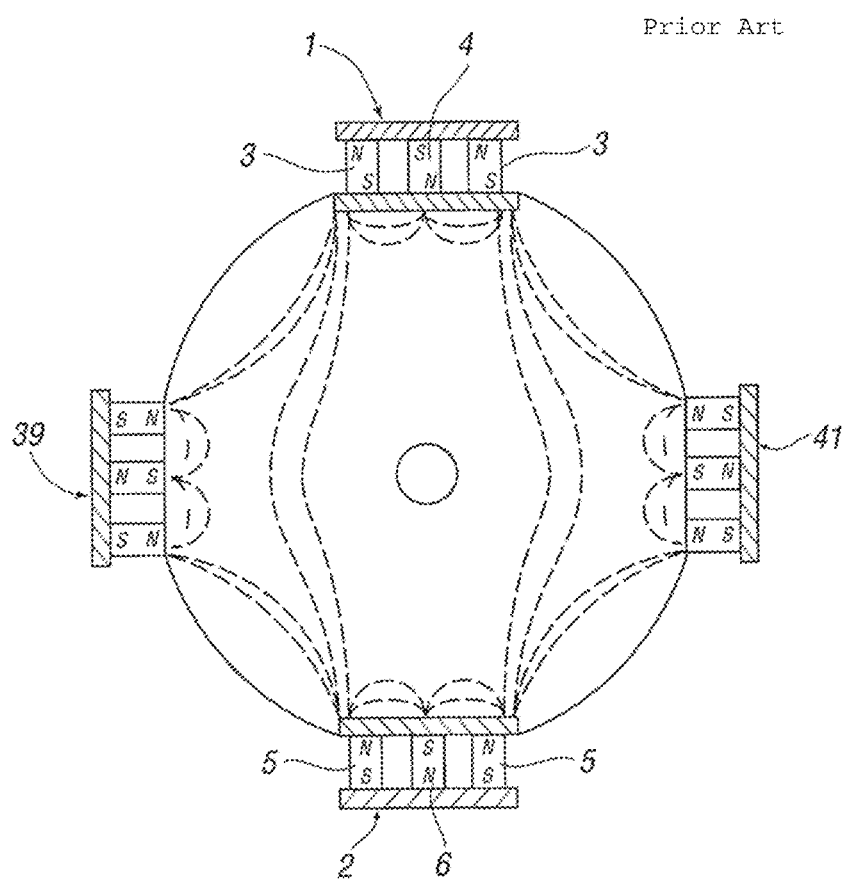
FIGS. 1a and b schematically illustrate a magnetron sputter ion plating system comprising two magnetrons and illustrating an arrangement of magnetic polarities in accordance with the invention.

FIGS. 1a and b and 2 schematically show the basic concept behind the present invention. In FIGS. 1a and b two magnetrons 1 and 2 each have an outer ring magnet 3 and a central core magnet 4. In FIG. 1a, which may be a practical arrangement, the outer magnet 3 of magnetron 1 is of "south" polarity and the inner core magnet 4 is of "north" polarity (in their regions adjacent a substrate 7). The outer magnet 5 of magnetron 2 is of north polarity and its core 6 of south polarity (in their 5 regions adjacent the substrate 7). Thus the magnetic field lines of magnetrons 1 and 2 form a continuous barrier, trapping electrons which diffuse from the magnetron plasmas.

FIGS. 1a and b also show the substrate 7 to be coated, target shrouds 8 of source material covering the exposed faces of the magnetron poles, and the magnetic field B. The magnetron poles have a soft iron backing plate 9 to complete their internal magnetic circuits.

As will be seen from FIGS. 1a and b, the magnetic field B fully surrounds the substrate 7 and serves to form a ring within which electrons are trapped. Since the electrons cannot escape the system they are available to enhance the ionisation associated with the substrate, creating a higher ion density than was previously possible.

FIG. 2 illustrates two magnetron pole assemblies disposed side by side, the magnetic flux B still bridging the gap between the assemblies and preventing the escape of electrons through the gap between them.

Figure 3:
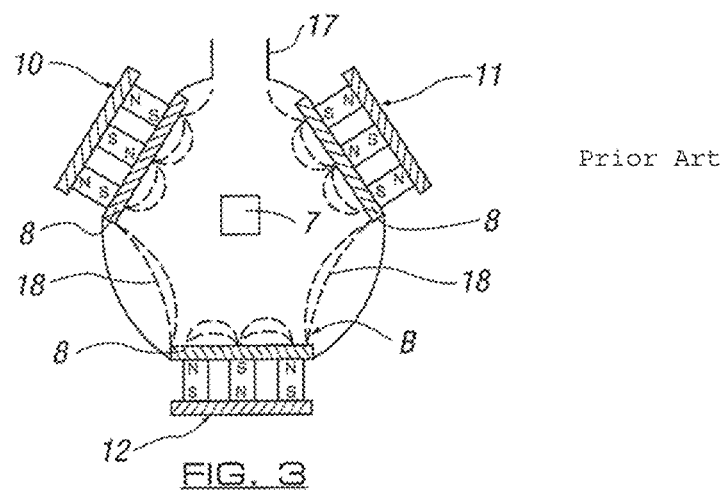
FIG. 3 illustrates schematically a practical version of a magnetron sputter ion plating system.

Turning to FIG. 3, this illustrates a practical form of the invention. Three magnetron pole assemblies 10, 11, 12 are provided approximately equi-angularly spaced with the substrate 7 at the centre of the triangle. Adjacent outer magnetic assemblies of the magnetrons 10 and 12 and 11 and 12 respectively are of opposite polarity. A pumping port 17 is provided between the two adjacent poles of similar polarity of assemblies 10 and 11.

Magnetic field lines 18 extend from the adjacent ends of the magnetrons 10 and 12, and the magnetrons 11 and 12 and prevent the escape of electrons through the gaps between the magnetrons 10 and 12 and 11 and 12.

Thus electrons cannot escape to earthed parts of the system, except in the region of the pumping port.

In use an inert gas such as argon is provided in the chamber of the system and electrons are accelerated in the chamber by a potential difference applied to the magnetron targets 8 to ionize the gas, producing more electrons and argon ions. The argon ions present in the chamber bombard the targets 8 of source material and produce a coating flux of source material. The argon ions also bombard the substrate. The magnetic field lines B serve to form a continuous barrier to the electrons diffusing from the magnetron discharges and ensure that these electrons are not lost to the system without performing their useful function of enhancing the glow discharge associated with the negatively electrically biased substrates, increasing the ion current to the substrate.

It should be appreciated that in each of the examples shown one or more magnetrons may be replaced by a magnet assembly with the same magnetic arrangement to maintain the magnetic flux.

Figure 4:
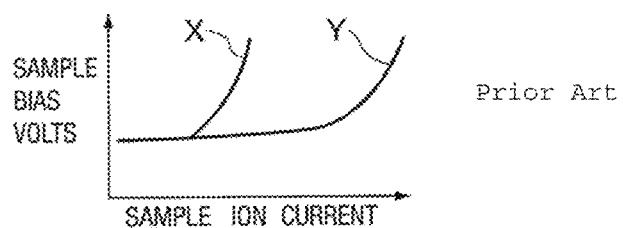
FIG. 4 shows the improvement in ion current of the embodiment of FIG. 3 in comparison with a known system.

FIG. 4 illustrates the improvement which the present invention can achieve. Line X shows the ion current available for different bias voltages in an arrangement similar to that of FIG. 3, but with each magnetron pole assembly being identical (for example, all three magnetrons having outer magnet assemblies with south poles akin to magnetrons 10 and 11) so that there is no flux between adjacent magnetrons. Line Y shows the ion current produced by the embodiment of FIG. 3 which is far higher because of the flux between adjacent assemblies trapping ionising electrons.

Figure 5:
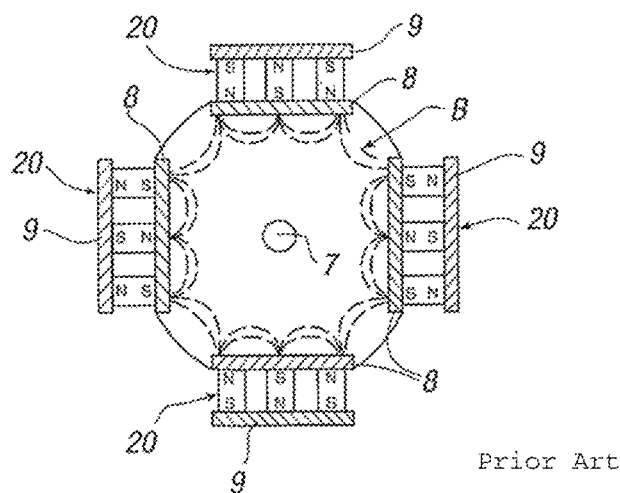
FIG. 5 illustrates another practical embodiment of the invention.

FIG. 5 shows another practical embodiment of a magnetron sputter ion plating system. Four magnetrons 20 are provided equi-angularly spaced in a ring with the substrate 7 at its centre. Each magnetron is similar to those described in FIG. 1 and similar components have been given similar reference numerals.

A pumping port (not shown) is provided out of the plane of the four magnetrons, for example the system may have the overall cylindrical shape of a dustbin and the pumping port may be provided at the base of the dustbin, with the magnetrons, and substrate, above the base.

The magnetic field B forms a continuous ring surrounding the substrate and traps electrons in the ring. Since an even number of magnetron pole assemblies is provided the flux ring can be complete.

There is an advantage in providing an even number of magnetrons and/or magnet assemblies. Six or eight magnetron pole assemblies are also considered good configurations, but clearly more could be provided if desired. Adjacent magnetrons would have outer magnet assemblies of opposite polarity.

Figure 6:
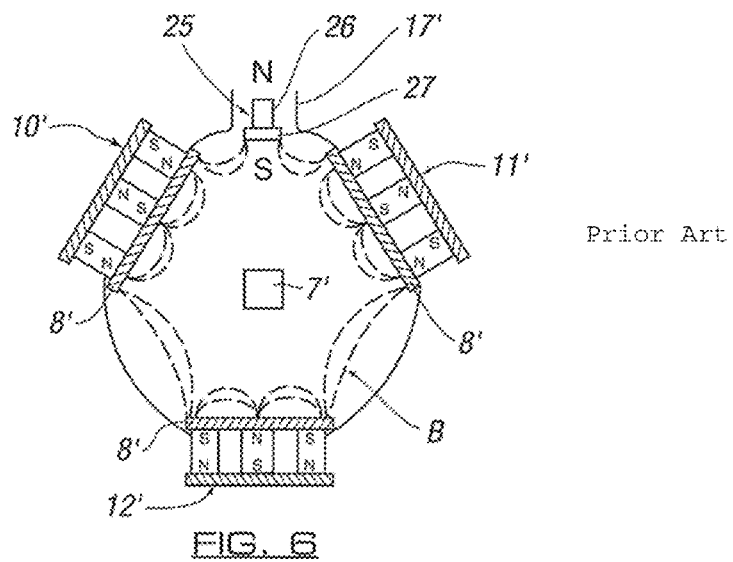
FIG. 6 shows a magnetron sputter ion plating system similar to that of FIG. 3, but modified.

FIG. 6 illustrates a system similar to that of FIG. 3, but modified to alleviate the loss of ionising electrons at the region between the two pole assemblies near to the pumping port. Similar components have been given similar reference numerals.

An electrode component 25 is provided between the adjacent poles of the same polarity of magnetrons 10' and 11', with the component 25 providing an additional magnetic pole of opposite polarity between the two similar adjacent poles. The component 25 comprises a magnet 26 and a cap 27 of ferromagnetic material. The electrode component 25 is at a floating potential (it is insulated from earth). The magnetic field lines from magnetrons 10' and 11' are attracted to the magnetic electrode 25, so providing a closed trap for electrons.

The type of additional magnetic electrode shown in FIG. 6 can be placed between neighbouring magnetron electrodes of similar polarity in a coating system to provide a barrier to the electrons escaping from the magnetron discharges, and so increase the intensity of ionisation and the ion current to the electrically biased substrates.

Figure 7:
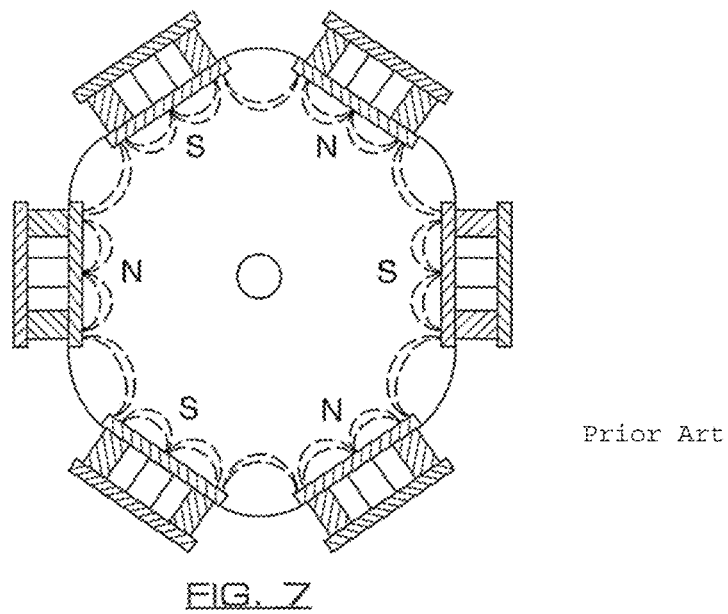
FIG. 7 shows a still further embodiment of the invention.

FIG. 7 illustrates another embodiment of the invention which has six magnetron pole assemblies, with next-neighbour outer pole assemblies having opposite polarity.

Figure 8:
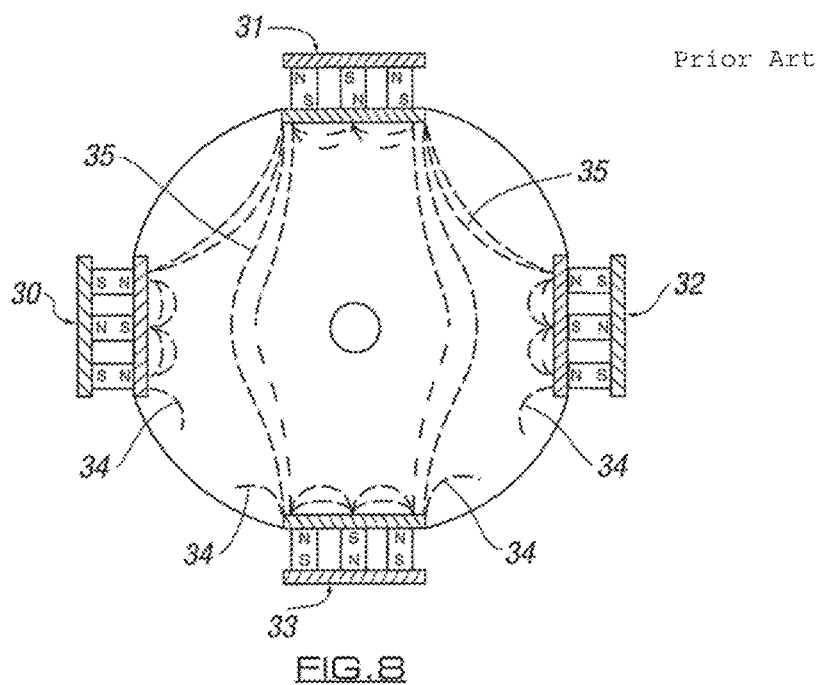
FIG. 8 shows a magnetron sputter ion plating system having four magnetron pole assemblies.

FIG. 8 shows a magnetron sputter ion plating system having four magnetron pole assemblies 30, 31, 32 and 33. Pole assemblies 30 and 32 have alternate polarities, but pole assembly 33 presents poles of the same polarity to the adjacent portions of pole assemblies 30 and 32. Some magnetic field lines, lines 34, are not closed and escape the system.

However, pole assemblies 31 and 33 also have magnetic field lines 35 connecting their regions of opposite polarity. A reasonable degree of magnetic closure still exists and we still achieve increased ionisation.

Figure 10:
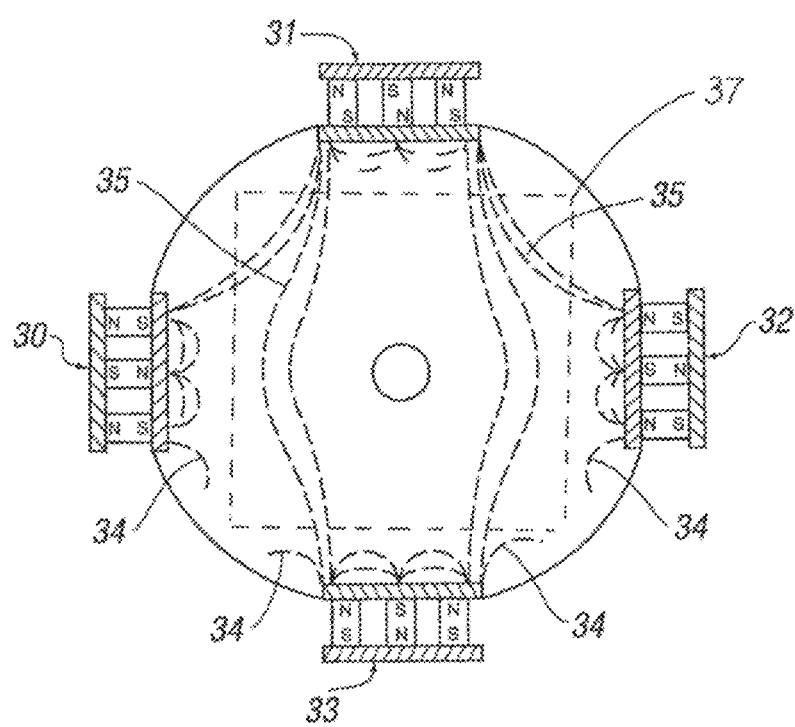
FIG. 10 illustrates a variation on the apparatus of FIG. 8.

An alternative arrangement of FIG. 8 is shown in FIG. 10 and discussed subsequently.

Even numbers of pole assemblies with next-neighbour assemblies being of opposite polarity are preferred (for example the embodiments of FIGS. 5 and 7), but other arrangements can work well.

Figure 9:
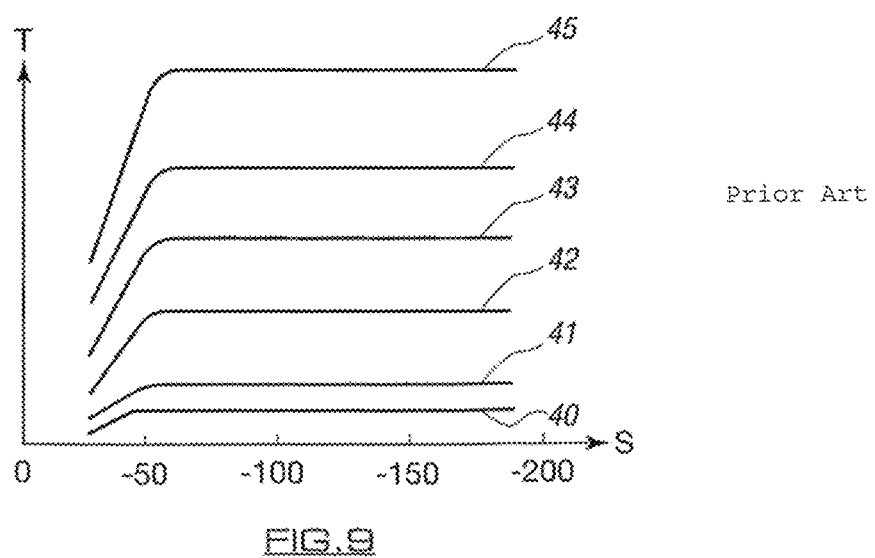
FIG. 9 is a graph comparing the ion current to a substrate against the bias.

FIG. 9 compares the performance of different magnetron sputter ion plating systems. Axis S represents the bias voltage applied to the substrate (in volts), and axis T represents the ion current to the substrate target. Lines 40 to 45 exemplify the performance of magnetron system having the following characteristics:

Line 40—Three pole assemblies (balanced) all of the same polarity and using ferrite magnets.

Line 41—Three pole assemblies (unbalanced), all of the same polarity and using ferrite magnets.

Line 42—Three mixed or alternating polarity magnetron pole assemblies (unbalanced), with ferrite magnets (as in the embodiment of FIG. 3).

Line 43—Three mixed or alternating polarity magnetron pole assemblies (unbalanced), with ferrite magnets, plus a dummy, or additional, pole assembly (as in the embodiment of FIG. 6).

Line 44—Four mixed or alternating polarity magnetron pole assemblies (unbalanced) with ferrite magnets.

Line 45—Four mixed or alternating polarity magnetron pole assemblies (unbalanced) with Nd Fe B magnets.

The ionisation enhancement effect of the "mixed" polaritymagnetron s is effective even when relatively weak magnets such as ferrites are used. The ionisation enhancement effect is even greater when stronger magnetic materials, such as Neodymium Iron Boron are used.

Arrangements of three and four magnetrons as shown in FIGS. 3 and 5 have been used for the deposition of titanium nitride and other hard coats. The high ionisation produced by the 'mixed' magnetron effect is important in depositing coatings with high adhesion and hard dense structures.

In one embodiment the method includes the step of cleaning the substrates prior to the application of material thereon. The aim of the method is typically to provide a coating with a high quality dense structure and which has good adhesion. In accordance with the invention, in one example, the method includes depositing a one component coating, such as TiN, in a standard production process such as that shown in FIG. 5 with four Ti targets. Good adhesion is achieved by switching on the magnetrons at low power while applying a high bias on the substrates thus bombarding the substrates with energetic Ar ions. Because of the plasma enhancement from the (CF) system the bombardment is intense and produces very efficient cleaning. The power is increased on the magnetrons and the bias voltage reduced on the substrates in order to deposit under optimum conditions. The first adhesion layer is Ti about 0.2 microns thick and then nitrogen is introduced to create the nitride coating.

For many advanced coatings, two component or three component coatings are applied, usually in the form of multi layers. One example of this in accordance with the current invention is the application of a CrAlTiN coating. If four magnetrons are provided as shown in FIG. 5 and powered for the ion cleaning (as above), the power is then increased on the magnetrons while reducing the bias voltage on the substrates. This creates an adhesion layer of CrAlTi alloy.

Such alloy coatings are usually highly stressed and can lead to adhesion failure. It is much better if the adhesion layer is a single metal element. In this case ion cleaning occurs with two Cr targets energised and the power is increased on these Cr targets to deposit a 0.2 micron adhesion layer of Cr. and then power up the Al and Ti targets while introducing the nitrogen. It is important during this process that efficient ion cleaning occurs and the Cr adhesion layer is deposited with the best structure.

A suitable arrangement is shown in FIG. 8 with 31 and 33 as Cr targets in opposing polarities and then 30 Al and 32 Ti both south polarities. ie this means that for many advanced coatings the arrangement of FIG. 8 is the arrangement of choice.

For other coatings, such as the Graphit iC (TM-Teer Coatings Ltd) coating, Cr targets are used in the 31 and 33 positions for ion cleaning and depositing the adhesion layer and Carbon targets are used in the 30 and 32 positions.

Thus in accordance with the invention the apparatus can be used for the ion cleaning of substrates and for the application of the initial adhesion layer and then to subsequently change the operating parameters of the apparatus to perform the main deposition of the material onto the substrates to form the desired coating thereon.

In a further embodiment, the apparatus provides escape paths for the ionising electrons at the top and bottom of the coating system. In one embodiment, plates 37 as shown in FIG. 10 are provided at floating potential at the top and bottom of the apparatus.

In one embodiment the method of use of the apparatus involves the steps of ion cleaning and then depositing an adhesion layer using magnetron targets 31 and 33 in the opposing polarity configuration and then subsequently the deposition of material from magnetron targets 30 and 32. This variation is shown in FIG. 10.

In this case the deposition is solely from targets 30 and 32 and it is of advantage to have their polarities arranged such that one has an outer polarity arrangement of a first polarity and the other has an outer portion with an opposing polarity as shown in FIG. 10.

In this case therefore 31 and 33 are provided with the opposing polarities as shown and 30 and 32 are also provided with opposing polarities. This is important for certain coatings such as MoST deposition where for example 31 and 33 can be used as Ti targets used to deposit a hard underlayer of TiN and then we would have 30 and 32 as MoS2 targets to deposit MoST in conjunction with a Ti target at low power.

The ion bombardment of the substrates is due to the ions formed in the glow discharge around the substrates being attracted to the substrates by the negative electrical bias voltage applied to the substrates. This bias voltage can be a DC voltage, or Radio Frequency power can be applied to the substrates in order to produce an induced negative voltage. The radio frequency technique is necessary when the substrates are of an electrically insulating material and/or when the coating material is electrically insulating, but can also be used when the substrates and the coating material are electrically conducting.

The improvements in coating adhesion and structure brought about by the increased ionisation due to the mixed magnetron polarity arrangement occur for both the DC and RF substrate bias.

Figure 11:
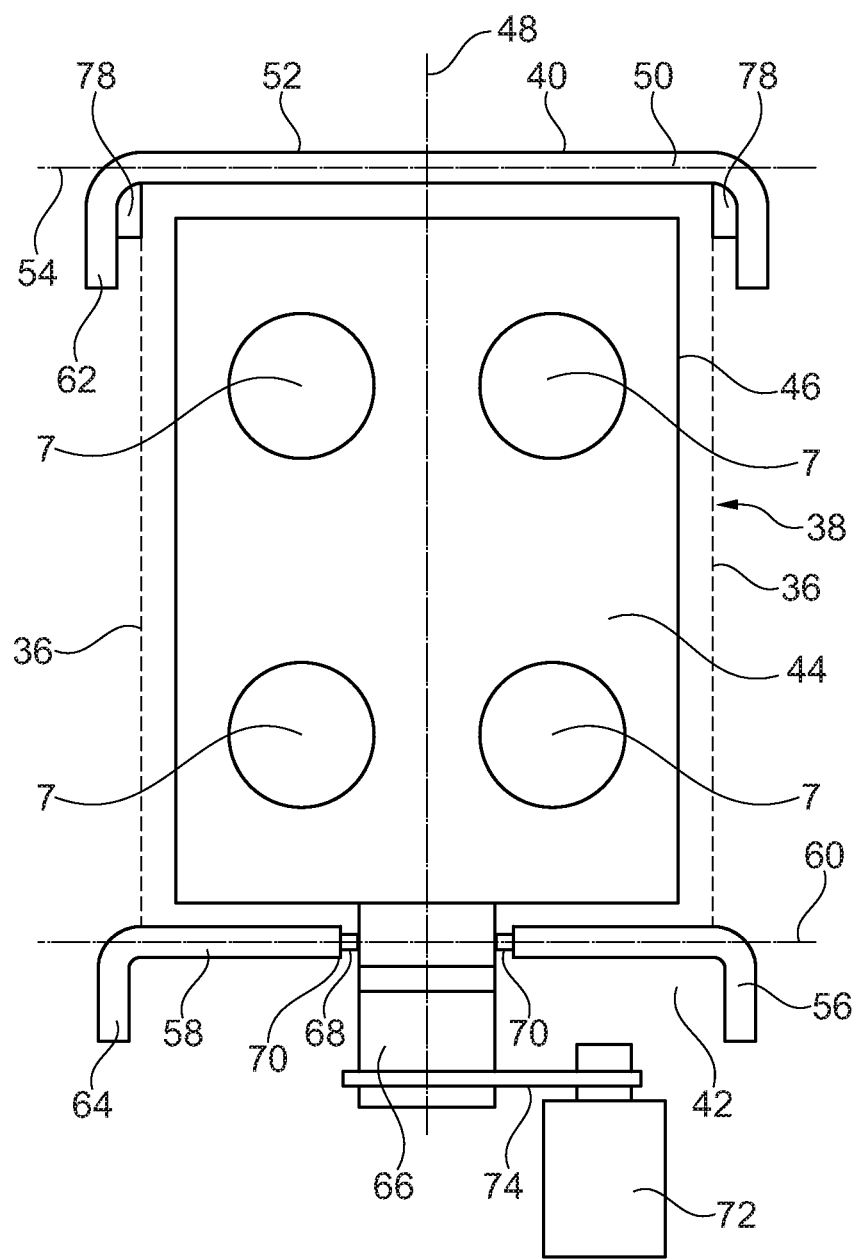
FIG. 11 there is shown an illustration of the interior of a chamber with the magnetrons removed for ease of illustration.

Referring now to FIG. 11 there is shown an illustration of the interior of a chamber with the magnetrons removed for ease of illustration and the side walls 36 of the chamber 28 shown in broken lines. The chamber has a top 40 and a bottom 42, and in this case a number of substrates 7 which are to be coated are mounted on a holder 44 located in the chamber 38. The magnetic field means are located in the chamber but not shown in FIG. 11 and these, as previously described, will comprise at least two magnetrons and/or magnet assemblies each having an inner portion and an outer portion of opposite polarity and arranged as a closed field such that the outer portion of at least one of the magnetrons or magnet assemblies has a first polarity and an adjacent magnetron or magnet assembly has an outer portion with opposite polarity so that magnetic field lines extend between said magnetrons and/or magnet assemblies and substantially prevent the escape of electrons from the system between the magnetrons and/or magnet assemblies and create the closed field 46 in which the holder 44 is located. The holder 44 is located so that the same is centrally mounted in the chamber 38 and is provided to be rotated about a first axis 48 which extends from the top 40 of the chamber to the bottom 42 of the chamber and a plate 50 is provided at floating potential and located at only the top 40 of the chamber. The plate has a body portion 52 which extends along a second axis 54 which is perpendicular to the said first axis and a second plate 56, spaced from the first plate, is provided at floating potential and located only at the bottom 42 of the chamber. This plate also has a body portion 58 which extends along a third axis 60 which is parallel with the second axis.

The plates are shown in cross section along the centre of the same and are typically circular in plan with each having a skirt portion 62, 64 respectively.

Typically, the first and second plates 50, 56 are provided with a bias of less than 120 Volts to reflect electrons towards the closed field 46 and hence towards said holder 46 and the substrates 7 mounted thereon. The first and second plates 50, 56 also act as covers for the top 40 and bottom 42 of the chamber 38 to prevent dust and debris passing into the chamber and locating on the surface of the substrates 7 and potentially causing problems with the coating formed on the substrates.

The chamber also includes a movement mechanism 66 provided to allow the holder 46 to be rotated and which passes through an aperture 68 in the plate 56 located at the bottom 42 of the chamber 38. The movement mechanism in one embodiment includes a motor 72 and a gearing and drive belt assembly 74.

The plates 50, 56 are electrically isolated from the movement mechanism 66 and the holder by insulation material 70, 78 which separates the plates from physical contact with the holder and movement mechanism.

What is claimed is:

1. A method of magnetron sputter ion plating in an apparatus including a chamber with a top and a bottom, in which the magnetic flux between a plurality of magnetrons and/or magnet assemblies located in the coating chamber comprises a substantially closed field ring which traps substantially all electrons which enter the ring within the ring, which method comprises:

locating at least one substrate to be coated on a holder within the ring, rotating the holder to provide relative movement between the at least one substrate and the magnetrons or magnet assemblies, and operating the magnetrons to deposit material from targets of material provided with respective magnetrons to form a coating of the deposited material onto the said at least one substrate, the magnetrons are initially operated with a bias applied to the at least one substrate to bombard the at least one substrate with ions to clean a surface of the at least one substrate onto which the coating is to be applied and the chamber is provided with side walls, a top and a bottom, the said at least two magnetrons and/or magnet assemblies are located at the side walls of the chamber and are arranged around the holder with the at least one substrate mounted thereon and the holder with the at least one substrate has a central position therein with the magnetrons and/or magnet assemblies substantially equally angularly spaced in a polygon or ring around the holder with the at least one substrate thereon, said holder provided to be rotated about a first axis, a first plate is provided at a bias of less than 120 Volts and located only at a top end of the chamber and extends along a second axis, which is perpendicular to the first axis and a second plate, spaced from the first plate, is provided at a bias of less than 120 Volts and is located only at the bottom end of the chamber and extends along a third axis, which is parallel with the second axis and the said at least one substrate is held at a negative electrical potential of up to −1000 Volts and a movement mechanism is provided to allow the holder to be rotated about the first axis at a location in the chamber intermediate the said first and second plates and wherein providing the said first and second plates as circular in shape and with a body portion which extends along the respective second and third axes and a skirt portion and which, in combination with the said bias of less than 120 Volts, reflects electrons towards the said holder and the at least one substrate mounted thereon.

2. A method according to claim 1 wherein material is deposited from targets of a first material to apply a layer of material onto the at least one substrate surface to act as an adhesive layer for the coating to be formed prior to the material being applied to form the remainder of the coating.

3. A method according to claim 1 wherein a first layer of the coating which is deposited acts as an adhesive layer.

4. A method according to claim 1 wherein once the said at least two magnetrons have been operated to deposit a first layer of material, further magnetrons are selectively operated to deposit material from the respective targets of material provided therewith to form a coating on the at least one substrate.

5. A method according to claim 4 wherein the material which is deposited to form the first layer is deposited from first and second magnetrons each having a target of said material and said first magnetron has an outer portion with a first polarity and the second magnetron has an outer portion with an opposing polarity.

6. A method according to claim 4 wherein following the deposition of the first layer at least one parameter of the operation of the apparatus is changed prior to the application of material from targets of the magnetrons to form the coating.

7. A method according to claim 1 wherein the first and second plates act as cover means for the chamber to prevent dust and debris locating onto the at least one substrate.

8. A method according to claim 1 wherein the said plates are electrically isolated from the movement mechanism and the holder by insulation material which separates the cover plates from physical contact with the holder and movement mechanism.

9. A method according to claim 1 wherein the movement mechanism includes a motor.

* * * * *